United States Patent
Wang

(10) Patent No.: US 11,201,162 B2
(45) Date of Patent: Dec. 14, 2021

(54) METHODS OF ERASING SEMICONDUCTOR NON-VOLATILE MEMORIES

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 27 days.

(21) Appl. No.: 16/230,048

(22) Filed: Dec. 21, 2018

(65) Prior Publication Data

US 2020/0203359 A1 Jun. 25, 2020

(51) Int. Cl.
| | |
|---|---|
| H01L 27/00 | (2006.01) |
| H01L 27/11558 | (2017.01) |
| H01L 27/11526 | (2017.01) |
| G11C 16/04 | (2006.01) |
| H01L 27/11573 | (2017.01) |

(52) U.S. Cl.
CPC .... H01L 27/11558 (2013.01); G11C 16/0441 (2013.01); G11C 16/0466 (2013.01); H01L 27/11526 (2013.01); H01L 27/11573 (2013.01)

(58) Field of Classification Search
CPC ........... H01L 27/11558; G11C 16/0441; G11C 16/0446
See application file for complete search history.

(56) References Cited

U.S. PATENT DOCUMENTS

| | | | | |
|---|---|---|---|---|
| 9,048,137 | B2 * | 6/2015 | Wang ................. | G11C 16/0441 |
| 10,431,308 | B1 * | 10/2019 | Wang ................. | G11C 16/0441 |
| 2003/0151948 | A1 * | 8/2003 | Bhattacharyya ........................... | |
| | | | | H01L 29/42332 |
| | | | | 365/185.18 |
| 2013/0234229 | A1 * | 9/2013 | Huang ................ | H01L 29/7881 |
| | | | | 257/321 |
| 2019/0237140 | A1 * | 8/2019 | Kim ................... | G11C 16/0425 |
| 2020/0203359 | A1 * | 6/2020 | Wang ................ | H01L 27/11526 |

\* cited by examiner

*Primary Examiner* — Kimberly N Rizkallah
*Assistant Examiner* — Alexander Belousov

(57) ABSTRACT

For erasing four-terminal semiconductor Non-Volatile Memory (NVM) devices, we apply a high positive voltage bias to the control gate with source, substrate and drain electrodes tied to the ground voltage for moving out stored charges in the charge storage material to the control gate. For improving erasing efficiency and NVM device endurance life by lowering applied voltage biases and reducing the applied voltage time durations, we engineer the lateral impurity profile of the control gate near dielectric interface such that tunneling occurs on the small lateral region of the control gate near the dielectric interface. We also apply the non-uniform thickness of coupling dielectric between the control gate and the storage material for the NVM device such that the tunneling for the erase operation occurs within the small thin dielectric areas, where the electrical field in thin dielectric is the strongest for tunneling erase operation.

9 Claims, 9 Drawing Sheets

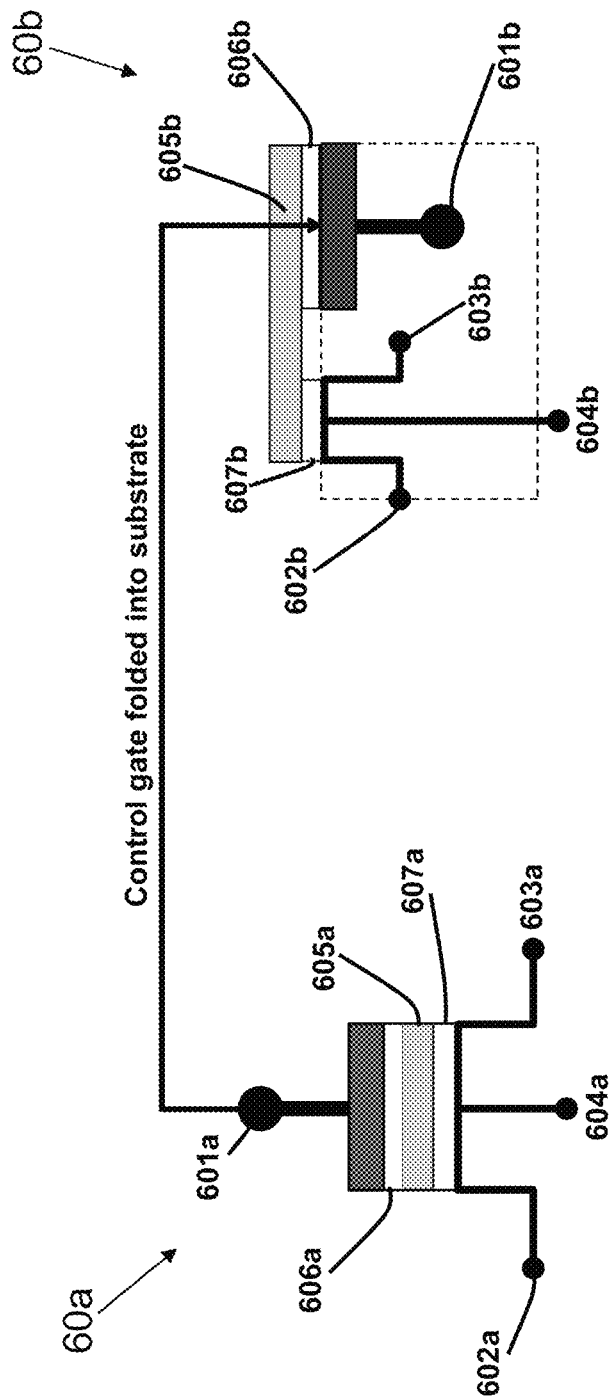
Fig. 6b — Single floating-gate LGNVM device
Fig. 6a — Conventional floating-gate (stacked double-gates) NVM device

METHODS OF ERASING SEMICONDUCTOR NON-VOLATILE MEMORIES

BACKGROUND OF THE INVENTION

Field of the Invention

The invention relates to the erasing schemes of semiconductor Non-Volatile Memory (NVM) devices. In particular, the capacitive coupling between the charge storage material and control gate can be designed to generate a strong electrical field at the wanted location(s) for transporting charges out of the charge storage material.

Description of the Related Art

An Electrical Erasable Programmable Read Only Memory (EEPROM) cells are the semiconductor NVM devices which can be electrically programmed and erased. The non-volatile property enables the memory device to retain the stored digital information once the power is turned off. The digital information is represented by the amounts of electrical charges stored in the charge storage material such as conducting floating gates, charge-trapping dielectric films, or nano-crystals. The charge storage material is always surrounded by insulating dielectric material in order to retain the charges representing the stored non-volatile information for a long period of time, usually greater than ten years. The non-volatile data is stored in a binary format in cells in a manner that each cell is set to the programmed state(s) and reset to the erased state. Programming the NVM cell is usually accomplished by placing electrons in the charge storage material by electrons tunneling through the insulating dielectrics or the injected high kinetic energy electrons passing through the insulating dielectrics. Erasing the EEPROM cells is done by removing the electrons from the charge storage material by electron tunneling through the insulating dielectrics or the injected high kinetic energy holes passing through the insulating dielectrics.

Sufficient strong electrical fields in the surrounded insulating dielectrics are necessary for electrons tunneling in/out of the storage material. For example, Fowler-Nordheim tunneling current in oxides (dielectrics) is given by $$I = a \times E^2 \times \exp\left(-\frac{b}{E}\right)$$

and Frankel-Pool emission in the charge-trapping dielectric is given by $I = \alpha \times E \times \exp(b\sqrt{E})$, where E is the electrical field, and the constants a and b are not related to electrical fields. Due to the exponential terms of the above equation, the electrical fields created by applying various voltage biases to the semiconductor NVM device's terminals must be strong enough to have a significant mobile current in the insulating dielectrics. FIG. 1 illustrates the Fowler-Nordheim tunneling erase operation in the tunneling oxides for the conventional floating-gate semiconductor NVM device by applying the ground voltage to the control gate terminal 101 and the other terminals (source electrode 102/drain electrode 103/substrate electrode 104) tied to a high positive voltage $V_h$. As the rule of thumb, the electrical field strength for Fowler-Nordheim tunneling in oxides is about $10^7$ V/cm, equivalent to applying a ~10 V voltage difference for an oxide thickness of 100 Å. When the strong electrical fields (>$10^7$ V/cm) are generated in the tunneling oxides between the floating gate 105 and the substrate 104 of the semiconductor NVM device, significant amounts of stored electrons in the floating gate 105 can be then tunneled out of the floating gate 105 to the source region 102/drain region 103/substrate region 104.

For the purpose of improving the erasing efficiency and the semiconductor NVM device endurance life by lowering the applied terminal voltage biases and reducing the applied voltage time durations, we have engineered the detailed capacitance coupling between the control gates and the charge storage materials of the semiconductor NVM devices.

SUMMARY OF THE INVENTION

To achieve high efficiency of the tunneling erase operation from the charge storage material to the control gate, we have designed the lateral impurity profile of the control gate near the dielectric interfaces as the low impurity concentrations in the middle region and high impurity concentrations in the two small edge regions as shown in FIG. 2. When a positive high voltage bias $V_h$ is applied to the control gate electrode 201a with the other terminals (source electrode 202/drain electrode 203/substrate electrode 204) tied to ground voltage (0 V), a charge depletion region 201d of the control gate 201 is formed from the dielectric interface 201c into the control gate electrode 201a caused by the low impurity concentrations as illustrated in FIG. 2. The depletion depth d in the middle region of the control gate 201 depends on the low impurity concentration depth profiles of the control gate 201 from the dielectric interface 201c and the magnitude of the applied voltage bias $V_{cg}$ to the control gate electrode 201a. The lower the impurity concentrations in the middle region and the higher the applied control gate voltage $V_{cg}$, the deeper the depletion depth d can penetrate into the control gate electrode 201a from the dielectric interface 201c. The control gate-to-floating gate capacitances between the control gate 201 and the floating gate 205 are also reduced by the increases of the depletion depth d.

To further illustrate the behind principle for simplicity, we apply the schematic of a floating-gate semiconductor NVM device in FIG. 3. The floating-gate semiconductor NVM device is a 4-terminal MOSFET device with control gate electrode 301, source electrode 302, drain electrode 303, and substrate electrode 304 for applying the voltage biases. The floating gate 305 is electrically isolated from the control gate electrode 301, the source electrode 302, the drain electrode 303, and the substrate electrode 304 to form the total control gate-to-floating gate capacitance $C_{cg}(V_{cg})=C_{cgm}(V_{cg})+2C_{cge}$, the source-to-floating gate capacitance $C_S$, the drain-to-floating gate capacitance $C_D$, and the substrate-to-floating gate capacitance $C_{sub}$, respectively, where the middle depletion capacitance $C_{cgm}(V_{cg})$ is reduced by the increasing applied control gate voltage $V_{cg}$ for the depletion depth increase of the low impurity profile region and $C_{cge}$ is the edged capacitance for the two non-depletion regions with high impurity concentration. Here, $C_{cg}(V_{cg})$ denotes $C_{cg}$ is a function of $V_{cg}$ and $C_{cgm}(V_{cg})$ denotes $C_{cgm}$ is a function of $V_{cg}$. Accordingly the voltage potential of the floating gate 305 is given by $$V_f = \frac{C_S V_S + C_{sub} V_{sub} + C_D V_D + C_{cg}(V_{cg}) V_{cg}}{C_S + C_{sub} + C_D + C_{cg}(V_{cg})}$$

where $V_s$, $V_{sub}$, $V_D$, and $V_{cg}$ are the applied voltage biases to the source electrode 302, the substrate electrode 304, the drain electrode 303, and the control gate electrode 301, respectively. When the control gate 301 is biased with a high voltage $V_h$ with other terminals of the semiconductor NVM device tied to the ground voltage for $V_s=V_{sub}=V_D=0$ V, the floating gate voltage potential is further simplified as $$V_f = \frac{C_{cg}(V_h)}{C_S + C_{sub} + C_D + C_{cg}(V_h)} V_h.$$

Here, $C_{cg}(V_h)$ denotes $C_{cg}$ is a function of $V_h$. The electrical field $E_{cg}$ generated between the control gate 301 and the floating gate 305 is thus given by $$E_{cg} \propto (V_h - V_f) = \frac{(C_S + C_{sub} + C_D)}{C_S + C_{sub} + C_D + C_{cg}(V_h)} V_h.$$

For a given control gate voltage $V_h$, the condition for maximizing the voltage difference across the control gate 301 and the floating gate 305 is $C_s+C_{sub}+C_D \gg C_{cg}(V_h)$. The situation also means that the full applied voltage difference $V_h$ is almost generated across the floating gate 305 and the control gate 301. However, although maximizing the voltage difference between the floating gate 305 and the control gate 301 can be achieved by reducing the total control gate-to-floating gate capacitance $C_{cg}(V_h)$ by the increase of depletion depth, the tunneling capability in the tunneling dielectric is also diminished for a uniform low impurity concentration control gate as shown in FIG. 4. This is because the control gate-to-floating gate capacitance $C_{cg}(V_{cg})$ for a uniform low impurity control gate is equivalent to the total series-connected capacitance of the dielectric capacitance $C_{ox}$ for the dielectric thickness $t_{ox}$ and the depletion capacitance $C_d$ for the depletion depth $t_d$ in the control gate 401, the electrical fields $$E_{ox} \propto \frac{C_d}{C_d + C_{ox}} V_h$$

for tunneling in the dielectric are significantly reduced by the depletion capacitance $C_d$. To resolve the dilemma for reducing the total control gate-to-floating gate capacitance for maximizing the applied voltage difference between control gate and floating gate while keeping the high tunneling capability in the dielectric, we have engineered the lateral impurity profiles of the control gate such that the small portions of the control gate (the edge portions of control gate in FIG. 2) with high interface impurity concentrations do not deplete into the control gate for the applied control gate voltage $V_h$, while the major portion of the control gate (the middle portion in FIG. 2) with low impurity interface concentrations deplete into the control gate for the total capacitance reduction to meet the condition of $C_{cg}(V_h) = C_{cgm}(V_h)+2C_{cge} \approx 2C_{cge} \ll C_S+C_{sub}+C_D$. Since the dielectrics below the non-depleted portions of the control gate receive the full electrical field strength for the maximized voltage difference $V_h$ in the dielectric, the tunneling for erase operation would occur in those two portions as the example in FIG. 2.

Please be noted that the two portions with higher impurity concentration in the control gate 201 in FIG. 2 are provided by way of example and not limitations of the invention. In the actual implementation, any other number of portions with higher impurity concentration can be used in FIG. 2 and this also falls in the scope of the invention.

The another method of minimizing the control gate-to-floating gate capacitance for the maximum voltage difference between the floating gate and control gate without depleting the control gate is to increase the dielectric thickness on the major portions of the control gate. FIG. 5 shows the schematic of the floating gate NVM device with two dielectric thicknesses between the control gate 501 and the floating gate 505. The total control gate-to-floating gate capacitance $C_{cg}$ is given by $C_{cg}=C_{cg1}+C_{cg2}$, where $C_{cg1}$ is the capacitance for the thick tunneling dielectric with thickness $t_1$ and $C_{cg2}$ is the capacitance for the thin tunneling dielectric with thickness $t_2$. To maximize the applied voltage difference $V_h$ across the floating gate 505 and control gate 501 for the condition of $C_S+C_{sub}+C_D \gg C_{cg}$, one can reduce $C_{cg}$ by increasing the thick dielectric thickness $t_1$ and the size ratio A1/A2 of thick tunneling dielectric and thin tunneling dielectric under the overlapped control gate surface areas, where A1 and A2 respectively denote sizes of the thick tunneling dielectric area and the thin tunneling dielectric area and A1>A2. The electrical fields in the dielectric thickness $t_1$ and $t_2$ are thus given by $$E_{cg1} = \frac{(V_{cg}-V_f)}{t_1} = \frac{(C_S+C_{sub}+C_D)}{(C_S+C_{sub}+C_D+C_{cg})}\left(\frac{V_h}{t_1}\right) \approx \frac{V_h}{t_1} \text{ and}$$

$$E_{cg2} = \frac{(V_{cg}-V_f)}{t_2} = \frac{(C_S+C_{sub}+C_D)}{(C_S+C_{sub}+C_D+C_{cg})}\left(\frac{V_h}{t_2}\right) \approx \frac{V_h}{t_2},$$

respectively. Since $E_{cg2}>E_{cg1}$ for $t_2<t_1$, we would have the tunneling occur in the areas overlapped under the control gate-floating gate through thin dielectric thickness $t_2$ as indicated in FIG. 5.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIGS. 6a and 6b depict the idea of the Logic Gate NMV (LGNVM) device transformed from the conventional floating-gate (stacked double gates) NVM device.

FIG. 7b shows a cross section view of impurity profiles for the control gates (wordline AA) of the LGNVM cell device array in FIG. 7a.

FIG. 9a shows a top view of the conventional floating gate device with thick and thin tunneling dielectrics between the floating gate and control gate.

FIG. 9b shows a cross section view of the cut line AA' in FIG. 9a.

DETAILED DESCRIPTION OF THE INVENTION

Figure 1:
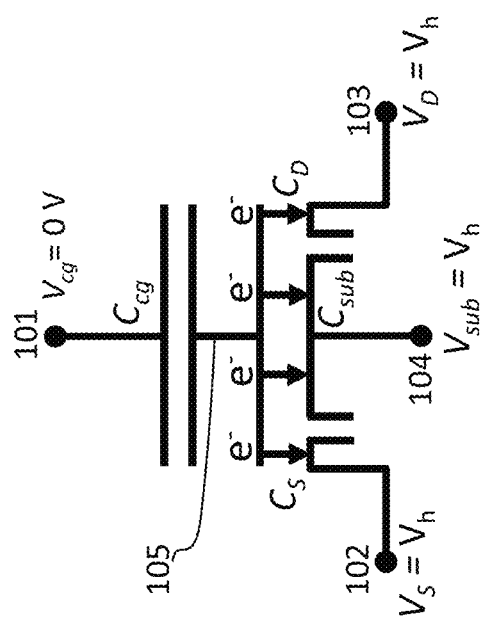
FIG. 1 shows the schematic for the conventional F/N tunneling erase operation for semiconductor NVM devices.
Figure 2:
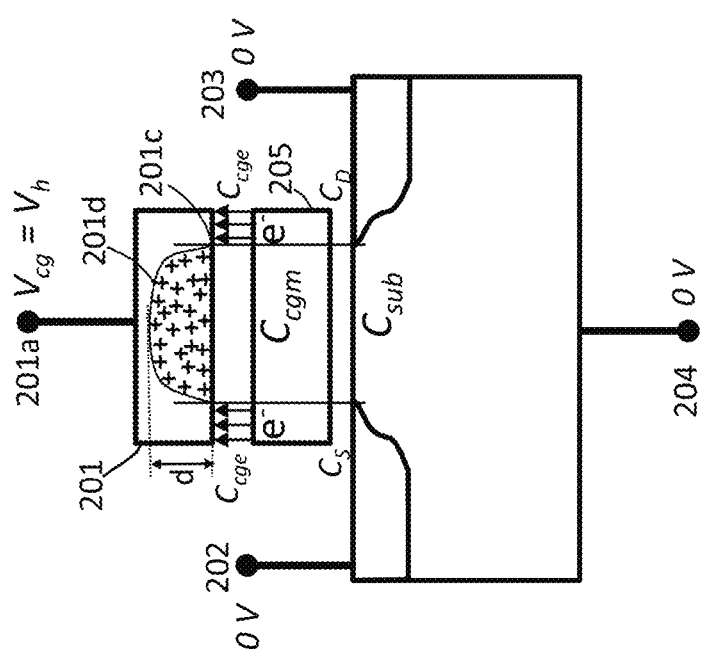
FIG. 2 depicts the F/N tunneling occurring at the two edges of the control gate for a non-uniform lateral impurity concentration profile with high impurity concentrations on the two edge regions and low impurity concentrations in the middle region according to an embodiment of the invention.
Figure 3:
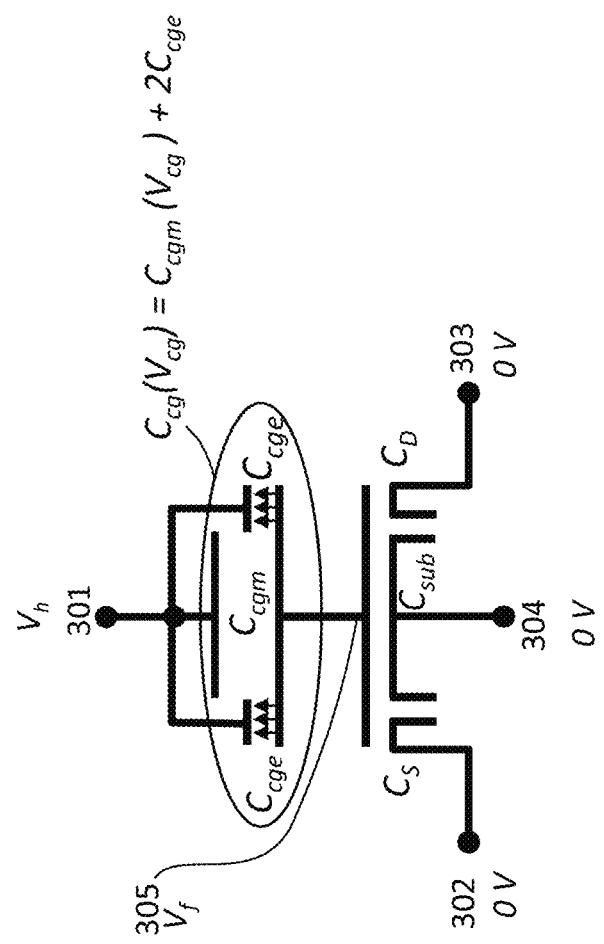
FIG. 3 shows the electrical schematic for the semiconductor NVM device depicted in FIG. 2.
Figure 4:
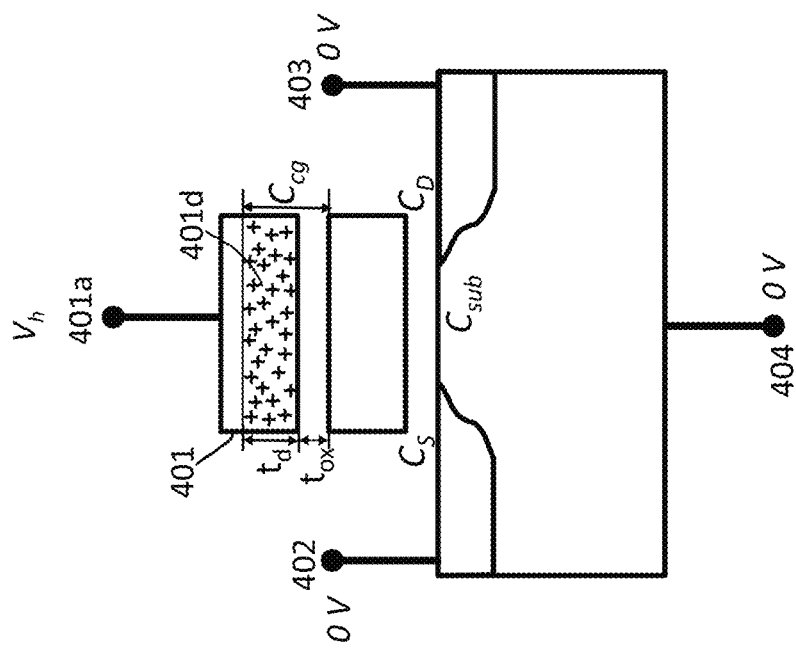
FIG. 4 illustrates the reduction of the electrical field in the tunneling dielectric for a low uniform impurity concentration control gate.
Figure 5:
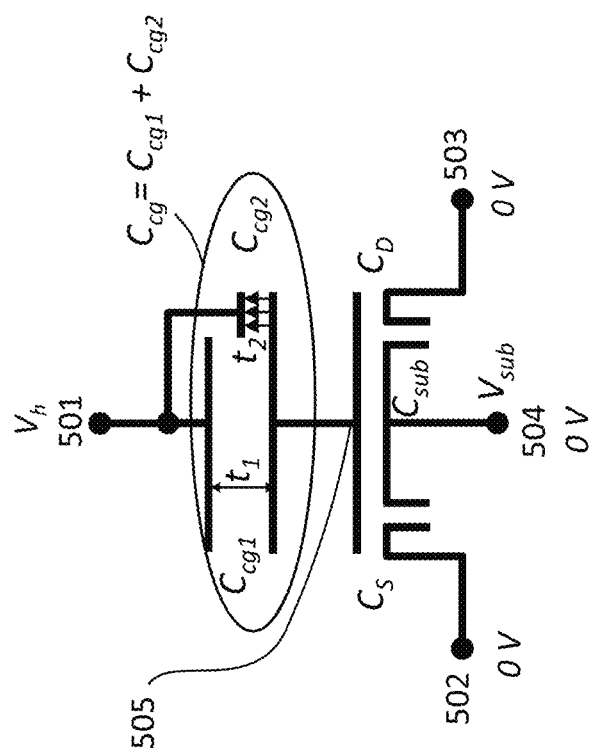
FIG. 5 shows the schematic for a semiconductor NVM device with two different dielectric thicknesses between the control gate and the floating gate according to another embodiment of the invention.

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

In one embodiment, we apply the erase operation scheme to the Logic Gate Non-Volatile Memory (LGNVM) devices as disclosed in U.S. Pat. No. 9,048,137 B2. The LGNVM device is similar to the conventional floating-gate NVM device with the structures of a single poly-gate as the floating gate and the control gate embedded in the silicon substrate fabricated with the standard CMOS logic technology process. FIG. 6b shows the capacitance coupling concept of LGNVM devices for folding the control gate of the conventional floating-gate NVM devices (FIG. 6a) into the silicon substrate. Referring to FIG. 6b, an N-type LGNVM device 60b includes a control gate 601b, a source electrode 602b, a substrate electrode 604b, a drain electrode 603b, a coupling dielectric 606b and a tunneling oxide 607b. For the N-type LGNVM device 60b, the N-type semiconductor control gate 601b is embedded in the P-type semiconductor substrate 604b. Referring to FIG. 6a, the conventional floating-gate NVM device 60a includes a control gate 601a, a source electrode 602a, a substrate electrode 604a, the drain electrode 603a, a coupling dielectric 606a and a tunneling oxide 607a. In contrast to the erase operation for the conventional floating-gate NVM devices 60a by applying a negative voltage (≤0V) to the control gate 601a and a positive voltage (≤0V) to the source electrode 602a, the substrate electrode 604a, and the drain electrode 603a, applying a negative high voltage to the control gates 601b of LGNVM devices 60b with source electrode 602b, the drain electrode 603b, and the substrate electrode 604b tied to a positive voltage (≥0V) is prohibited due to the forward biasing for the junctions of the embedded N-type control gate 601b and the P-type substrate 604b. The only option for applying a voltage bias on the N-type control gates 601b of LGNVM devices 60b is to apply a high positive voltage (≤0V) to the N-type control gates 601b of LGNVM devices 60b with other terminals (source/drain/substrate) tied to the zero voltage or negative voltages for the reverse biased junctions. For the erase operation, the maximum applicable control gate voltage bias is capped by the breakdown voltage for the junctions of the embedded N-type control gate 601b and the P-type substrate 604b. The low junction leakage current for the embedded N-type control gate applied with a positive voltage below the junction breakdown voltage is necessary for maintaining the applied positive voltage from the loading of the charge pumping circuitry for the F/N tunneling erase operation. It is very desirable for applying a lower positive control gate voltage with very low junction leakage currents between the N-type control gate 601b and the P-type substrate 604b to achieve the erase operation. In order to have a lower applied control gate voltage, we would like to have the most of the applied voltage difference generated in the tunneling dielectric 606b between the floating gate 605b and the control gate 601b. With this objective in mind, we engineer the lateral impurity profiles of the embedded N-type control gate near the substrate surfaces by adding extra high impurity concentration extension tips 712 under the two edges of the floating gate 710 for the embedded N-type control gate as shown in FIG. 7b.

Figure 7B:
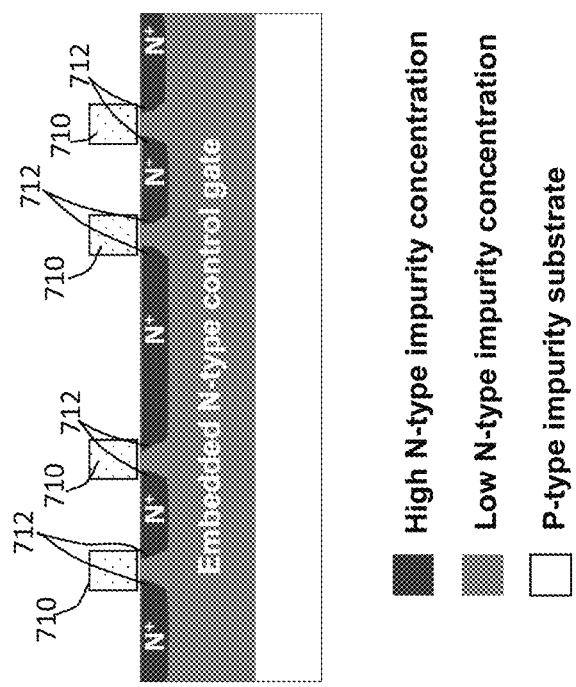
Figure 7A:
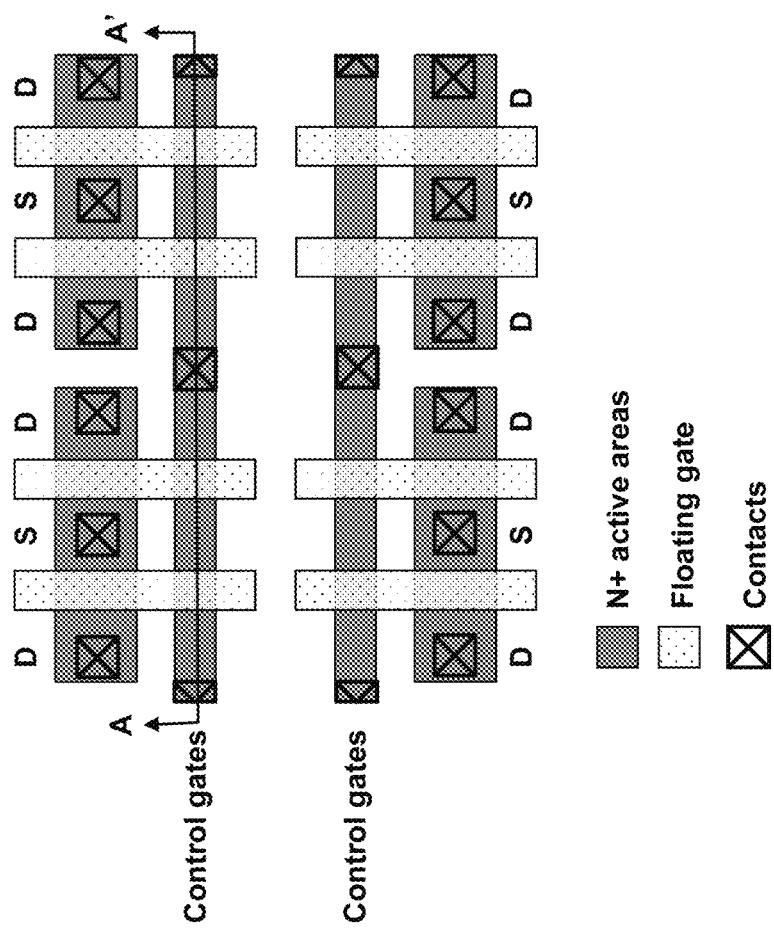
FIG. 7a shows a top view of the LGNVM cell device array.
Figure 8:
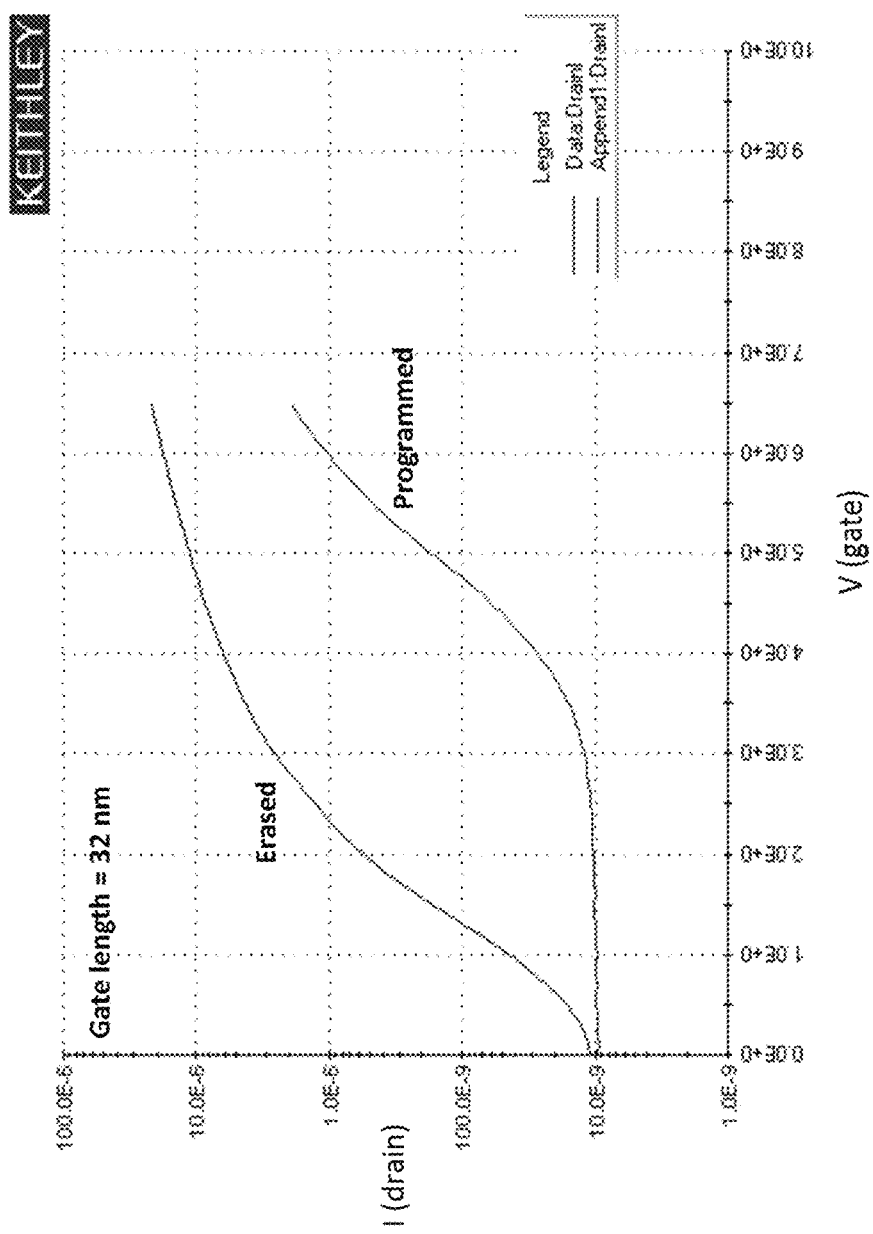
FIG. 8 shows the LGNVM electrical characteristics for the erase and programmed device by applying the erase scheme according to one embodiment of this invention.

FIG. 7a shows the top view of the LGNVM device and FIG. 7b shows the cross section view of the impurity profiles for the N-type control gates (wordline AA') of the LGNVM device in FIG. 7a. The N-type impurity profiles of the control gate with high concentration extension tips 712 (FIG. 7b) are formed without adding a new process by using the same fabrication process for the highly doped N-type extension of typical NMOSFET (N-type Metal Oxide Semiconductor Field Effect Transistor) devices in the deep submicron CMOS logic process technology. The fabrication process for the highly doped N-type extension of the typical NMOSFET in a deep submicron CMOS logic process is usually done by a low energy and high dose arsenic implant before the devices' spacer formation. FIG. 8 shows the LGNVM device electrical characteristics for the programed LGNVM device and the erased LGNVM device fabricated by the foundry's 40 nm CMOS logic process technology, where the Fowler-Nordheim tunneling erase operation can be only accomplished by the scheme of this invention.

Figures 9A, 9B:
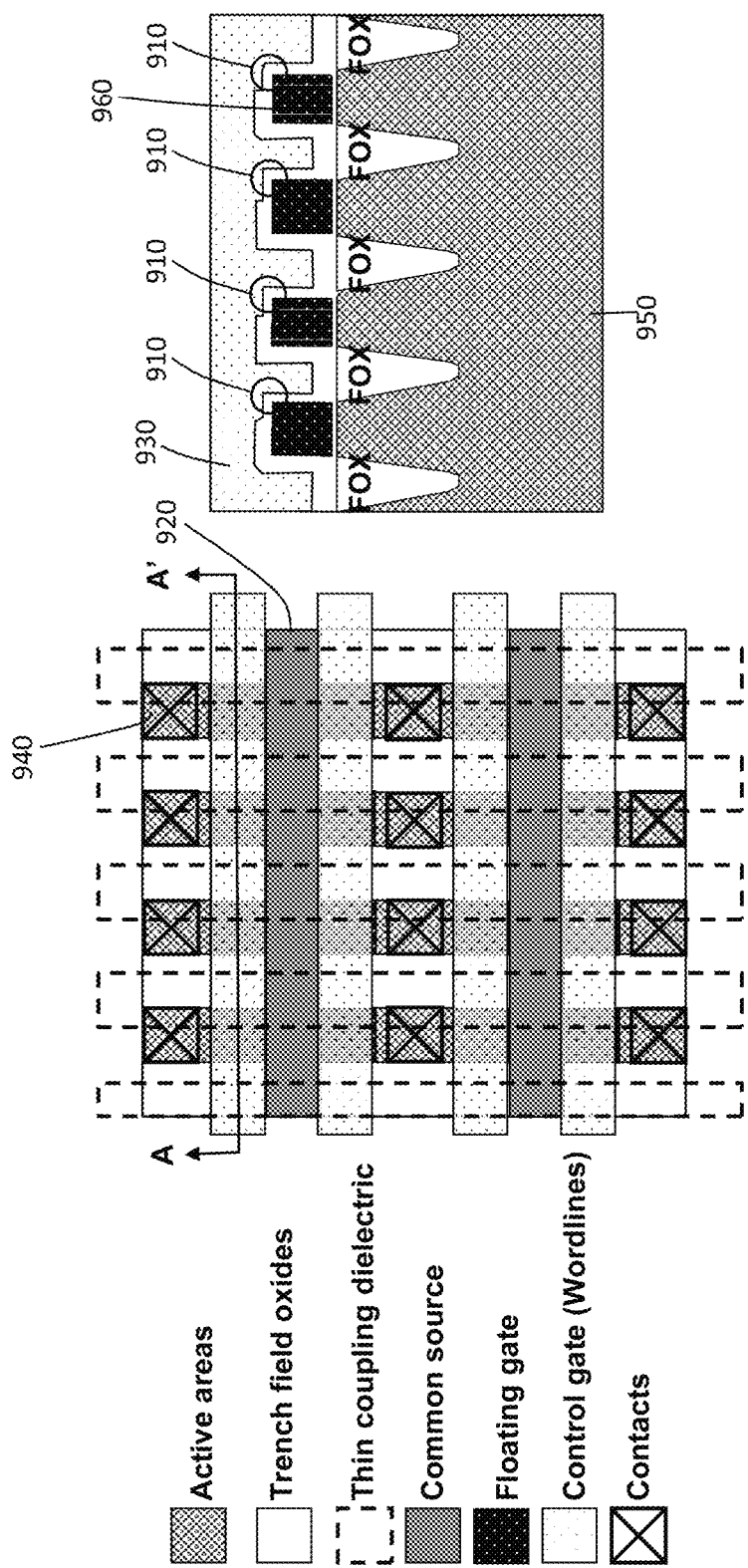

In another embodiment, we apply the dielectric thickness increase on the major areas of the control gate for the floating-gate (stacked double-gates) semiconductor NVM cell device to reduce the total control gate-to-floating gate capacitance $C_{cg}$ for $C_S+C_{sub}+C_D>>C_{cg}$. FIG. 9a shows a top view of a typical floating-gate NOR flash array and FIG. 9b shows a cross section view of the control gates along a wordline (AA line in FIG. 9a). In the conventional floating-gate NVM fabrication process, the first dielectric film is deposited on the top of the floating gate 960 for the formation of coupling dielectrics before depositing the second poly-silicon film. In the embodiment, we can remove the first dielectric film for the areas inside the dash lines of the clear tone mask as shown in FIG. 9a. A thin tunneling dielectric of 60 Å~300 Å thick oxides can be then grown or deposited on to the removing areas of the first dielectric film to form the thin tunneling oxides in the thin tunneling oxide areas 910. When a row of control gates (a wordline) 930 is applied with a high positive voltage with the common source 920, bitline (drain electrodes) 940, and the substrate 950 tied to the ground voltage (0 V), the tunneling erase occurs in the thin tunneling oxide areas 910 between floating gate 960 and control gate 930.

Although the charge storage material in the above embodiments and examples are described herein in terms of floating gates, it should be understood that embodiments of the invention are not so limited, but are applicable to any type of the charge storage material, such as charge-trapping dielectric film and nano-crystal grains.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of erasing a semiconductor nonvolatile memory (NVM) device, the semiconductor NVM device on a substrate comprising a source electrode, a drain electrode, a charge storage material and a control gate, the method comprising:

applying a first voltage to the source electrode, the drain electrode and an electrode of the substrate; and applying a second voltage to an electrode of the control gate so that electrons tunnel from the charge storage material to the control gate;

wherein the first voltage is less than or equal to zero and the second voltage is greater than or equal to zero;

wherein the control gate consists of a first impurity region and N second impurity regions that overlap the charge storage material with a tunneling dielectric film interposed between the charge storage material and the control gate, and wherein the N second impurity regions have a higher impurity concentration than the first impurity region and N>=1.

2. The method according to claim 1, wherein the step of applying the second voltage comprises:

applying the second voltage to the electrode of the control gate so that the electrons tunnels from the charge storage material through a portion of the tunneling dielectric film to the N second impurity regions and a charge depletion region is formed within the first impurity region from its surface in contact with the tunneling dielectric film.

3. The method according to claim 2, wherein a depth of the charge depletion region extending from its surface in contact with the tunneling dielectric film into the control gate depends on the impurity concentration of the first impurity region and a magnitude of the second voltage.

4. The method according to claim 3, wherein a control gate-to-charge storage material capacitance is reduced as the depth of the charge depletion region in the control gate increases.

5. The method according to claim 2, wherein the charge depletion region is not formed within the N second impurity regions.

6. The method according to claim 2, wherein if the control gate is embedded in the substrate, the maximum of the second voltage is a breakdown voltage for a junction of the control gate and the substrate.

7. The method according to claim 2, wherein a voltage difference between the control gate and the charge storage material is maximized if the following condition is satisfied: $C_{cg}=C_{cgm}+N \times C_{cge} \approx N \times C_{cge} \ll C_S+C_{sub}+C_D$, where $C_{cg}$ denotes a control gate-to-charge storage material capacitance, $C_{cgm}$ denotes a first impurity region-to-charge storage material capacitance, $C_{cge}$ denotes a second impurity region-to-charge storage material capacitance, $C_S$ denotes a source-to-charge storage material capacitance, $C_D$ a drain-to-charge storage material capacitance, and $C_{sub}$ denotes a substrate-to-charge storage material capacitance.

8. The method according to claim 7, wherein $C_{cg}$ and $C_{cgm}$ are functions of the second voltage.

9. The method according to claim 1, wherein the charge storing material is made of one selected from the group consisting of conducting floating gate, charge-trapping dielectric film and nano-crystal grains.

* * * * *